(12) United States Patent
Mandell et al.

(10) Patent No.: US 8,929,483 B1
(45) Date of Patent: Jan. 6, 2015

(54) MULTI-CHANNEL DIGITAL LINEARIZATION

(71) Applicant: RKF Engineering Solutions LLC, Washington, DC (US)

(72) Inventors: Michael Mandell, Farmington Hills, MI (US); Ted Kaplan, North Potomac, MD (US); Arnold Berman, Washington, DC (US); Jeffrey Freedman, Laurel, MD (US); Brian Sipos, Alexandria, VA (US); Scott Conrad Markley, Washington, DC (US); Erik Halvorson, Vienna, VA (US); David Marshack, Bethesda, MD (US)

(73) Assignee: RKF Engineering Solutions, LLC, Washington, DC (US)

( * ) Notice: Subject to any disclaimer, the term of this patent is extended or adjusted under 35 U.S.C. 154(b) by 0 days.

(21) Appl. No.: 13/841,102

(22) Filed: Mar. 15, 2013

Related U.S. Application Data

(60) Provisional application No. 61/697,163, filed on Sep. 5, 2012.

(51) Int. Cl.
*H04L 25/03* (2006.01)
*H04B 1/64* (2006.01)

(52) U.S. Cl.
CPC .......................................... *H04B 1/64* (2013.01)
USPC .......................................... 375/297; 455/114.3

(58) Field of Classification Search
CPC ................ H03F 2201/3206; H03F 2201/3233; H03F 2201/3236; H04B 2001/0425; H04L 27/367
USPC .......................................... 375/297; 455/114.3
See application file for complete search history.

(56) References Cited

U.S. PATENT DOCUMENTS

| | | | | |
|---|---|---|---|---|
| 7,142,615 | B2 * | 11/2006 | Hongo et al. | 375/297 |
| 7,146,138 | B2 * | 12/2006 | Anvari | 455/114.3 |
| 2013/0243123 | A1 * | 9/2013 | Bai | 375/297 |
| 2014/0009225 | A1 * | 1/2014 | Laporte | 330/103 |
| 2014/0016725 | A1 * | 1/2014 | Peroulas et al. | 375/297 |

* cited by examiner

*Primary Examiner* — Sophia Vlahos
(74) *Attorney, Agent, or Firm* — Fish & Richardson P.C.

(57) ABSTRACT

Digital baseband channel signals are received and up-sampled to a common sampling rate. The digital baseband channel signals are filtered using low pass filters. Complex frequency shifting is performed of the filtered digital baseband channel signals based on the associated different channel frequencies to obtain digital channel signals, which are combined to generate a digital wideband multi-channel signal that is a digital representation of an analog wideband multi-channel signal that is based on combining analog channel signals that correspond to the analog baseband channel signals. A non-linear pre-distortion of the digital wideband multi-channel signal is performed, the non-linear pre-distortion adding at least one of a gain and a phase shift to the digital wideband multi-channel signal such that the digital channel signals included within the digital wideband multi-channel signal are compensated for a non-linear distortion effected on the analog wideband multi-channel signal by a high-power amplifier.

15 Claims, 4 Drawing Sheets

MULTI-CHANNEL DIGITAL LINEARIZATION

CROSS-REFERENCE TO RELATED APPLICATIONS

This application claims priority to U.S. Provisional Application No. 61/697,163 filed on Sep. 5, 2012, and titled "MULTICHANNEL DIGITAL LINEARIZATION," which is incorporated herein by reference in its entirety for all purposes.

TECHNICAL FIELD

The following disclosure is related to multi-channel digital linearization of a high power amplifier.

BACKGROUND

Some communication systems receive signals over multiple channels. The signals may be amplified by passing them through a high power amplifier.

SUMMARY

The present disclosure describes methods, systems and devices for performing multi-channel digital linearization of a high power amplifier (HPA). In some implementations, digital signals corresponding to multiple channels are interpolated. A low pass filter is applied to the interpolated signals, which are then frequency shifted based on their respective channel frequencies prior to digitally combining the signals to form a composite wideband digital signal. The composite wideband digital signal is then digitally pre-distorted to compensate for distortions of the HPA and then, using complex frequency shifting, low pass filtering, and decimation, is decomposed into respective pre-distorted baseband digital signals corresponding to each of the multiple channels. The pre-distorted baseband digital signals are then converted into analog signals, up-converted to their appropriate channel frequency, combined, and then inputted into the HPA. By pre-distorting the wideband signal in the digital domain, rather than in the analog domain, the linearization of the HPA may be improved.

The details of one or more aspects of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
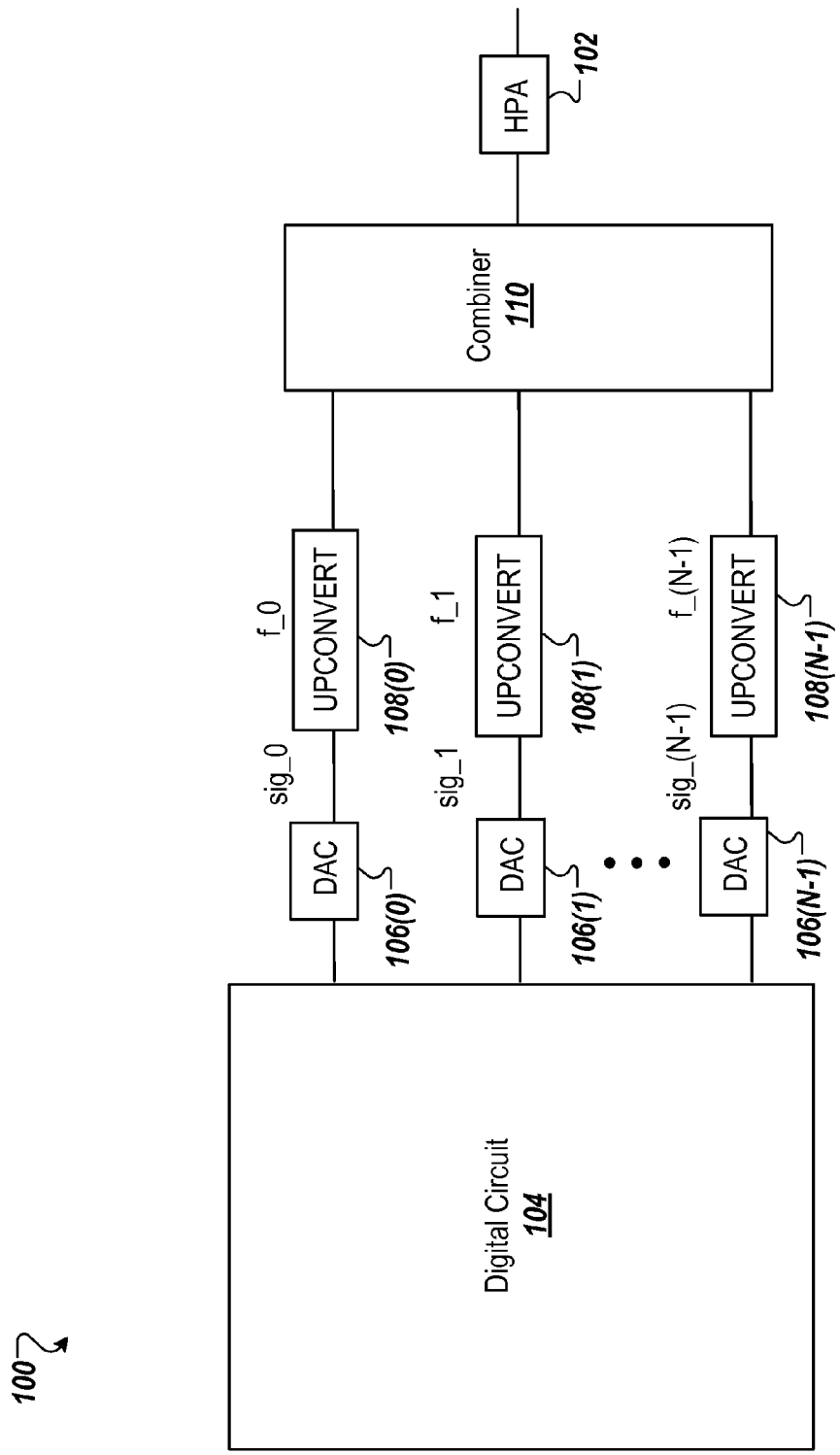
FIG. 1 illustrates an example system for multi-channel digital linearization.

Some communication systems that transmit data between sources and destinations use high-power amplifiers (HPA) for amplifying a signal that is received from a source, before the signal is forwarded to a destination. For example, a satellite communications system may use a satellite to connect users via communication channels (also referred to simply as channels) that are established through the satellite. The satellite uses multiple antenna elements in, for example, a phased array antenna or as part of a reflector antenna, to form one or more communication beams for communicating with user devices on the ground or with other satellites. A source user terminal transmits a signal stream that is received by receiving antenna elements on the satellite. The signal stream is switched by the satellite to multiple transmit antenna elements for transmitting to the destination user terminal. Each of the transmit antenna elements may be coupled to an HPA that amplifies the signal stream before the signal is forwarded to the destination user terminal.

In this context, an HPA is a type of amplifier, which is an electronic device that is configured to increase the power of a signal received at its input. The amplifier takes energy from a power supply and controls the output signal to match the input signal in shape, but with greater amplitude. In this sense, the amplifier modulates the output of the power supply.

The HPA may be, for example, a radio-frequency (RF) power amplifier, which is an amplifier that converts a low-power RF signal into a larger signal of significant power (that is, increases the gain of the signal), typically for driving the antenna of a transmitter. Uses of the HPA may include, for example, driving a transmitting antenna in a communications system, driving to another high power source, and exciting microwave cavity resonators. As described by the preceding example, RF HPA may boost a signal in a communications system, which may be useful, for example, to mitigate the effects of signal fading on a communication path.

All amplifiers exhibit some level of nonlinear distortion. In general, nonlinear distortion increases as the output power from the amplifier increases. Thus, for HPAs, nonlinear distortion is an important performance metric critical to system performance.

Some systems may use HPAs that are configured to handle wideband signals (that is, signals with a large frequency spectrum). This may be useful to reduce the cost, or complexity, or both of such a system since a wideband HPA can handle more signals than a baseband HPA and therefore the system can function effectively with a lower number of HPAs. For example, a communication system may combine three complex baseband signals, each of bandwidth 500 Mega-hertz (MHz) into a wideband signal of bandwidth 1.5 Giga-hertz (GHz) that is then amplified by the HPA. When the wideband signal is processed by an HPA, the signal may get distorted due to the intrinsic characteristics of the HPA, which may be caused by the properties of the electronic circuits that implement the HPA. The distortion may affect the signal gain, such that the amplitude of the output signal is not a linear function of the amplitude of the input signal. In addition, the phase of the output signal may be different from the phase of the input signal due to the distortion.

The effect of the distortion may be more pronounced as the saturation limit of the HPA is reached, which denotes an upper limit of the amplification performed by the HPA. The three baseband signals described above may be combined in a manner such that all three reach their peak amplitudes at the same time, resulting in very high amplitude of the wideband signal that is input into the HPA. The high amplitude of the wideband signal may saturate the HPA, which cannot amplify to a further higher value, such that the amplified signal at the output of the HPA is clipped at the saturation limit.

The output y of the HPA therefore may not be a linear transform of the input x, and the relationship may be expressed as y=f(x), where f is a non-linear function. The relationship is referred to as the non-linear distortion property, or non-linear characteristic of the HPA.

In some typical systems, the non-linear effect of an HPA on a signal may be countered by performing a pre-distortion or linearization of the signal before the HPA receives the signal. In such systems, an analog electronic circuit, which may be referred to as the linearizer, is placed immediately before the HPA. The signal is passed through the linearizer, which attempts to pre-distort the signal. That is, the linearizer provides a gain and phase shift to the signal to counter the distortion in gain and phase of the signal that is subsequently caused by the HPA. For example, the HPA may introduce a certain phase shift (say, 5 degrees) to the signal that depends on the level of the signal. The linearizer may introduce an opposite phase shift (say, −5 degrees) to cancel the effect of the phase shift by the HPA. As another example, the linearizer may adjust the amplitude of the signal by a certain amount to cancel the non-linearity in amplification (such as, due to the saturation limit) by the HPA, such that the signal produced at the HPA output is at the desired level.

Some other typical systems may counter the non-linear effect of the HPA on an input signal by digitally pre-distorting the signal before it is inputted into the HPA. Pre-distortion in the digital domain may be desirable over pre-distortion in the analog domain because of the enhanced accuracy that digital processing typically provides as compared to analog processing. For example, the performance of analog electronic circuits may vary with time and/or temperature, among other reasons. In contrast, pre-distortion in the digital domain may yield greater accuracy in the operations and be less susceptible to variations in the environment or in the characteristics of the components over time.

In a system implementing digital pre-distortion, a digital linearizer circuit may be used to pre-distort a signal provided to an HPA. Specifically, the digital linearizer circuit may receive a single digital baseband signal and may produce a corresponding single pre-distorted digital baseband signal that is pre-distorted to compensate for distortion introduced by the HPA. The single pre-distorted digital baseband signal may then be input into a single digital-to-analog converter (DAC) to produce a corresponding single pre-distorted analog baseband signal that may then be up-converted to its appropriate carrier frequency prior to being amplified by the HPA. However, since there is only a single digital path to the HPA, such systems do not digitally pre-distort each of multiple different analog baseband channel signals for transmission over different frequency channels of a wideband analog signal that is input into an HPA.

It may be useful to implement a communications system that is configured to perform pre-distortion of a multi-channel analog wideband signal in the digital domain. This may be achieved in a communications system that implements circuitry that receives multiple different digital baseband signals, each corresponding to a different frequency channel of the wideband signal. The digital baseband channel signals are frequency shifted based on their respective channel frequencies and combined to form a digital version of the multi-channel wideband analog signal. Pre-distortion is performed on the digital multi-channel wideband signal, which is then digitally split into corresponding pre-distorted digital baseband channel signals. The pre-distorted digital baseband channel signals are converted into pre-distorted analog baseband channel signals that are then up-converted and combined to form a pre-distorted version of the multi-channel analog wideband signal for input into the HPA. The pre-distortion imparted by this system onto the multi-channel analog wideband signal reduces or eliminates the distortion effects caused by the HPA.

Such a system effectively performs pre-distortion of the individual channel signals of the multi-channel wideband signal in the digital domain based on what the multi-channel wideband signal is going to look like all the way downstream when it is inputted into the HPA. Therefore, multiple analog channel signals are separately pre-distorted in a manner that preserves their individual characteristics during non-linear distortion of the combined multi-channel wideband signal by the HPA. Accordingly, the individual channel components of the multi-channel wideband signal at the output of the HPA include less nonlinear distortion than if the pre-distortion were not used.

In this context, the term "less nonlinear distortion" means that the waveform of the amplified output signal is largely identical to the waveform of the input analog signal. The amplitude of the output signal is a multiplicative version (by some suitable constant) of the input analog signal, while the phase of the output signal is the same as, or nearly the same as, the phase of the input analog signal.

System, methods and devices are described in the following sections for performing digital linearization of multiple input signals in a communications system. For the purposes of this discussion, the terms "signal," "stream," "channel" and "waveform" are used interchangeably. The terms "amplifier," "power amplifier," "HPA" and "RF HPA" are used synonymously. The terms "communications system," "communications network" and "network" are used synonymously.

FIG. 1 illustrates an example system 100 for multi-channel digital linearization. The system 100 includes a HPA 102 and a digital circuit 104 that produces N digital pre-distorted baseband signals, each corresponding to one of N different channels labeled from 0 to N−1 that have corresponding channel frequencies f_0 to f_(N−1). The N digital pre-distorted baseband channel signals produced by the digital circuit 104 correspond to N digital baseband signals received by the digital circuit 104 that have been pre-distorted by the digital circuit 104 to compensate for distortions that will be subsequently introduced by the HPA 102. The system 100 also includes digital-to-analog converters (DACs) 106(0), 106(1), through 106(N−1), which are collectively referred to as 106(0) . . . 106(N−1), and upconverters 108(0), 108(1), through 108(N), which are collectively referred to as 108(0) . . . 108(N−1). In addition, the system 100 includes a combiner 110.

The system 100 is part of a communications system that amplifies communication signals as they are forwarded by the communications system from a source to a destination. For example, the system 100 may be implemented in a satellite communications system. The system 100 may be part of the circuitry for each antenna radiating element in a satellite in the satellite communications system. As another example, the system 100 may be implemented in a terrestrial network. The system 100 may be included in repeaters that amplify signals as they are forwarded from one section of the terrestrial network to another section.

The system 100 is used for performing pre-distortion in the digital domain of signals in multiple channels that are combined to form a wideband multi-channel signal before passing through the HPA 102. In some implementations, the frequency spectra for the different channel signals may not be contiguous such that arbitrary-sized spectral gaps may exist between the channel signals.

N individual, digital, baseband channel signals are input into the digital circuit 104. The digital circuit 104 frequency shifts the baseband channel signals based on their respective channel frequencies and then combines the frequency shifted signals into a wideband multi-channel digital version and pre-distorts the wideband multi-channel digital version. The digital circuit then obtains pre-distorted digital baseband channel signals by frequency shifting the pre-distorted wideband multi-channel digital version back to the baseband for each respective channel and using a low pass filter to isolate the channel signal from the other channel signals. The pre-distorted digital baseband channel signals may then be converted into pre-distorted analog baseband channel signals. For example, the pre-distorted digital channel 0 baseband signal may be output to DAC 106(0), which may convert the signal into a pre-distorted analog signal sig_0. Similarly, the pre-distorted digital channel 1 baseband signal may be output to DAC 106(1), which may convert the signal into a pre-distorted analog signal sig_1.

The baseband analog channel signals are subsequently forwarded to upconverters in their respective channels. An upconverter is an electronic circuit that changes the frequency of an input signal to a different frequency. For example, sig_0 is forwarded from DAC 106(0) to upconverter 108(0), which up-converts sig_0 from the baseband to the channel 0 frequency f_0. Similarly, sig_1 is forwarded from DAC 106(1) to upconverter 108(1), which up-converts sig_1 to the channel 1 frequency f_1. All the baseband channel signals are likewise up-converted to their respective channel frequencies, ending with sig_(N−1), which is up-converted by upconverter 108(N−1) to the channel N−1 frequency f_(N−1). The upconverters 108(0) . . . 108(N−1) up-convert the signals to non-overlapping frequency spectra so that they do not overlap in frequency when they are combined into the wideband signal.

The combiner 110 is an electronic circuit that mixes all of the complex analog channel signals together to form a multi-channel complex wideband analog signal, which is then input into the HPA 102. The multi-channel wideband analog signal is amplified by the HPA 102. In the process, the HPA 102 may introduce some non-linear distortion, such as phase shift and signal clipping, among others. However, the pre-distortion performed by the digital circuit 200 may mitigate or nullify the effects of the non-linear distortion such that the output multi-channel wideband analog signal of the HPA 102 may be a substantially linear transform of the input multi-channel wideband analog signal.

The pre-distortion performed by the digital circuit 104 as described above may counter or reduce the non-linear distortion caused by the HPA 102 in a manner that allows the individual analog components in the wideband analog signal at the output of the HPA 102 to be a substantially linear transform of the corresponding input analog components. Therefore, performing pre-distortion using the digital circuit 200 facilitates amplification of multi-channel analog signals without distortion in their waveforms, when the analog channel signals are input into the HPA 102 as part of a multi-channel wideband analog signal that is amplified by the HPA 102.

Figure 2:
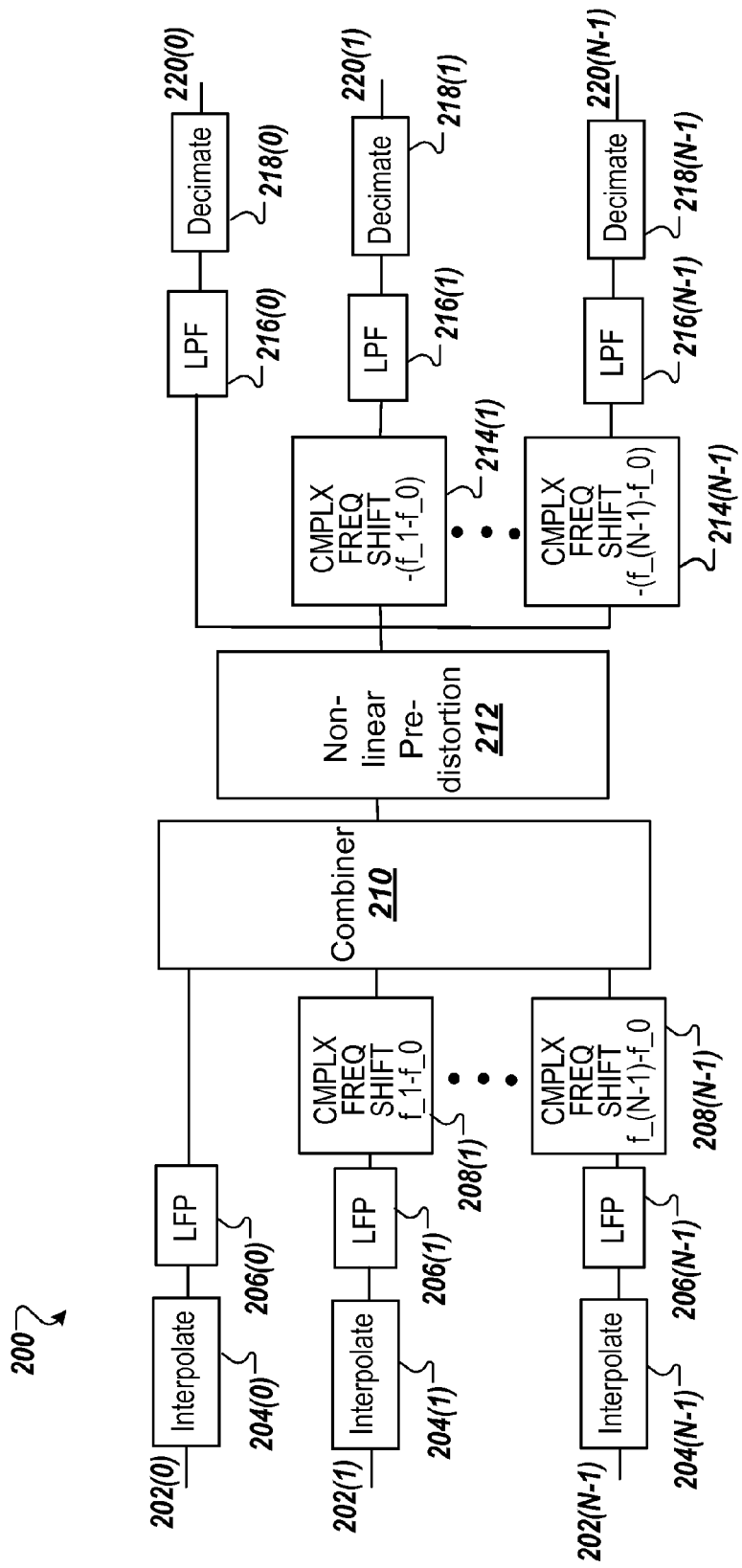
FIG. 2 illustrates a block diagram of an example digital circuit for performing multi-channel digital linearization.

FIG. 2 illustrates a block diagram of an example digital circuit 200 for performing multi-channel digital linearization. The digital circuit 200 performs pre-distortion in the digital domain of baseband signals corresponding to multiple channels, before the signals are combined into a wideband multi-channel signal for input into the HPA. The digital circuit 200 may be an implementation example of the digital circuit 104 that is shown as part of system 100. For ease of exposition, therefore, the following section describes the digital circuit 200 as corresponding to the digital circuit 104 of the system 100. However, the digital circuit 200 also may be implemented in other systems.

The digital circuit 200 receives N digital baseband signals 202(0) through 202(N−1), each corresponding to one of N different channels labeled from 0 to N−1 that have corresponding channel frequencies f_0 to f_(N−1), respectively. For example, a communications system may be forwarding signal streams for ten different communication channels. The communication system receives the ten different channel-specific signal streams and, if necessary, converts them into digital versions (for example, by using analog-to-digital converters) to arrive at the digital waveforms 202(0) through 202(N−1).

The digital circuit 200 includes interpolators 204(0) through 204(N−1), low pass filters (LPFs) 206(0) through 206(N−1) and 216(0) through 216(N−1), complex frequency shift circuits 208(1) through 208(N−1) and 214(1) through 214(N−1), and decimators 218(0) through 218(N−1). The digital circuit 200 outputs N pre-distorted digital baseband signals 220(0) through 220(N−1) that correspond to versions of signals 202(0) through 202(N−1), respectively, that have been pre-distorted to reduce or nullify distortions caused by an HPA (e.g., HPA 102 of system 100).

Each of the digital baseband signals 202(0) through 202(N−1) is interpolated by a corresponding interpolator 204(0) through 204(N−1), which is an electronic circuit that is configured for up-sampling a signal that is input into the interpolator. The digital signals are up-sampled so that the sample rate that is used in the subsequent stages is the same for all the signals. The up-sampling is performed because the individual baseband signals are subsequently combined together into a wideband signal that has a much greater bandwidth compared to any of the individual signals. In some implementations, the sample rate of a digital signal may be changed by adding zero samples. The interpolation rate may be sufficiently large such that the Nyquist criterion is satisfied for the signal bandwidth for the subsequent input into the HPA (for example, HPA 102).

When the digital signals 202(0) through 202(N−1) are interpolated, aliases may be generated for each digital signal, which are artifacts that result in multiple copies of a digital signal being created at different frequencies due to the up-sampling. For each digital signal, the alias components are removed by passing the signal through a corresponding LPF 206(0) through 206(N−1).

Each of the channel 1 through channel N−1 baseband digital signals is then passed through a complex frequency shift circuit 208(1) through 208(N−1), respectively, which is an electronic circuit that is configured for shifting the frequency of a signal at its input. The complex frequency shift circuits shift the frequencies of the corresponding baseband digital channel signals such that the frequencies of the output signals are at the appropriate relative offsets with respect to each other. For example, the complex frequency shift circuit 208(1) shifts the channel 1 baseband signal 202(1) by the difference between the channel 1 frequency and the channel 0 frequency, i.e., by f_1-f_0. Similarly, the complex frequency shift circuit 208(N−1) shifts the channel N−1 baseband signal 202(N−1) by the difference between the channel N−1 frequency and the channel 0 frequency, i.e., by f_(N−1)-f_0.

The frequency shift is performed such that the digital signals do not overlap in frequency when they are combined together into the wideband representation. If the digital signals were combined at the baseband without performing the complex frequency shift, then the digital signals would overlap in frequency, resulting in interference from one another. Each digital signal at the output of the frequency shift circuit is at a frequency spectrum that is different from other digital signals, and corresponds to the position of the digital signal in the frequency spectrum of the combined digital wideband signal. Therefore, the relative positions of the individual digital signals in the wideband digital representation is similar to the relative positions of the corresponding analog signals when they are re-converted (for example, by the DACs 106$a$ . . . 106$n$) and combined together (for example, by the combiner 110) into the analog wideband signal that is input into the HPA (for example, the HPA 102).

The up-sampled and frequency-shifted digital channel signals are then added together by the combiner circuit 210 to create a digital wideband multi-channel signal, which is the digital version of the analog wideband multi-channel signal. The digital wideband multi-channel signal is generated because the digital circuit 200 is configured to apply the pre-distortion to the digital wideband multi-channel signal rather than separately to each of the respective digital channel signals in view of the fact that the HPA amplifies and, hence, distorts the corresponding analog wideband multi-channel signal, rather than separately amplifies and distorts each of the respective analog channel signals.

The digital version of the multi-channel wideband signal is input into the non-linear pre-distortion module 212, which is an electronic circuit that is configured for performing linearization on a signal that is input into the module. The non-linear pre-distortion module 212 may implement one or more standard linearization techniques to the input signal.

In some implementations, the module 212 determines the amplitude of the digital wideband multi-channel representation that is input into the module 212, performs a table lookup to map the determined amplitude of the input signal to an output amplitude. The module 212 also determines the phase of the input signal and performs a table lookup to determine the phase shift that is to be applied to the digital wideband multi-channel representation based on the phase of the input signal.

The table lookups provide values of the output amplitude and the phase shift that counter the amplitude distortion and phase shift, respectively, that would subsequently be applied to the corresponding analog wideband multi-channel signal when passed through the HPA. For example, upon performing a table lookup based on the input amplitude, the module 212 may determine that the HPA would distort the analog wideband multi-channel signal by reducing the gain (that is, the amplitude) at the output of the HPA by 1 dB and by shifting the phase of the HPA output by 5 degrees, compared to the situation where the analog wideband multi-channel signal is not distorted. Therefore, the module 212 may pre-distort the digital wideband multi-channel representation by adding a gain of 1 dB to the digital wideband multi-channel signal, and shifting the phase of the digital wideband multi-channel signal by -5 degrees.

The output of the non-linear pre-distortion module 212 is a digital version of the wideband multi-channel signal that is input into the HPA, where the digital version has been pre-distorted by the module 212 to compensate for the distortion in gain and phase that would be imparted subsequently by the HPA. The digital circuit 200 then performs operations that are inverse operations of the operations performed by the digital circuit in the stages preceding the combiner 210, in order to generate pre-distorted versions of the baseband digital signals 202(0) through 202(N−1).

Specifically, the pre-distorted digital wideband signal output by the non-linear pre-distortion module 212 is passed through the complex frequency shift circuits 214(1) through 214(N−1) to undo the operations performed by the complex frequency shift circuits 208(1) through 208(N−1), respectively. For example, a complex frequency shift circuit 214(1) may shift the frequency of the pre-distorted channel 1 signal back to the baseband by shifting its frequency by the difference between the channel 0 frequency and the channel 1 frequency, i.e., by $-(f\_1-f\_0)$. Similarly, other complex frequency shift circuits 214(2) through 214(N−1) perform frequency shifts corresponding to their respective pre-distorted channel-specific signals. For example, complex frequency shift circuit 214 (N−1) may shift the frequency of the pre-distorted channel N−1 signal back to the baseband by shifting its frequency by the difference between the channel 0 frequency and the channel N−1 frequency, i.e., by $-(f\_(N-1)-f\_0)$.

Each of the pre-distorted baseband digital channel waveforms is separated out from the other channel waveforms by passing a respective frequency-shifted version of the combined signal through LPFs 216(0) through 216(N−1). Specifically, LPF 216(0) filters the combined signal to obtain a pre-distorted and up-sampled version of the channel 0 signal 202(0), while removing the other channel signals. LPFs 216(1) through 216(N−1) similarly filter their respective frequency-shifted versions of the pre-distorted wideband multi-channel signal to obtain pre-distorted and up-sampled versions of the channel 1 through channel N−1 signals 202(1) through 202(N−1).

The up-sampled, pre-distorted, baseband channel waveforms are then input into decimators to down-sample the waveforms to their original sample rates. For example, the up-sampled, pre-distorted versions of the waveform 202(0) through 202(N−1) are input into respective decimators 218(0) through 218(N−1) to produce the pre-distorted channel 0 through N−1 baseband waveforms 220(0) through 220(N−1). The N pre-distorted digital baseband signals 220(0) through 220(N−1) correspond to versions of signals 202(0) through 202(N−1), respectively, that have the same respective sample rates and that have been pre-distorted to reduce or nullify distortions caused by an HPA (e.g., HPA 102 of system 100).

Each of the pre-distorted digital waveforms 220(0) through 220(N−1) may then be converted into corresponding analog baseband signals (for example, using the DACs 106$a$ . . . 106$n$), up-converted and then combined to form the analog wideband multi-channel signal that is input into the HPA (for example, HPA 102). Due to the pre-distortion that is performed on the individual channel digital waveforms by the digital circuit 200, the effects of the distortion by the HPA, if any, may be reduced.

The digital circuit 200 may be implemented in any communications system where multiple analog baseband channel signals are combined into an analog wideband multi-channel signal before being amplified by a wideband HPA. For example, the digital circuit 200 may be used in a satellite communications system. A wideband HPA may be connected to a dish antenna in a base station that is transmitting signals to the satellite; the system 100 including the digital circuit 200 may be coupled to the dish antenna on the path before the signal is fed to the HPA. Alternatively, or in addition, an HPA may be coupled to each antenna element on board a satellite that is transmitting signals. The system 100 including the digital circuit 200 may be connected to such antenna elements for processing the signals before being amplified by the HPAs.

Figure 3:
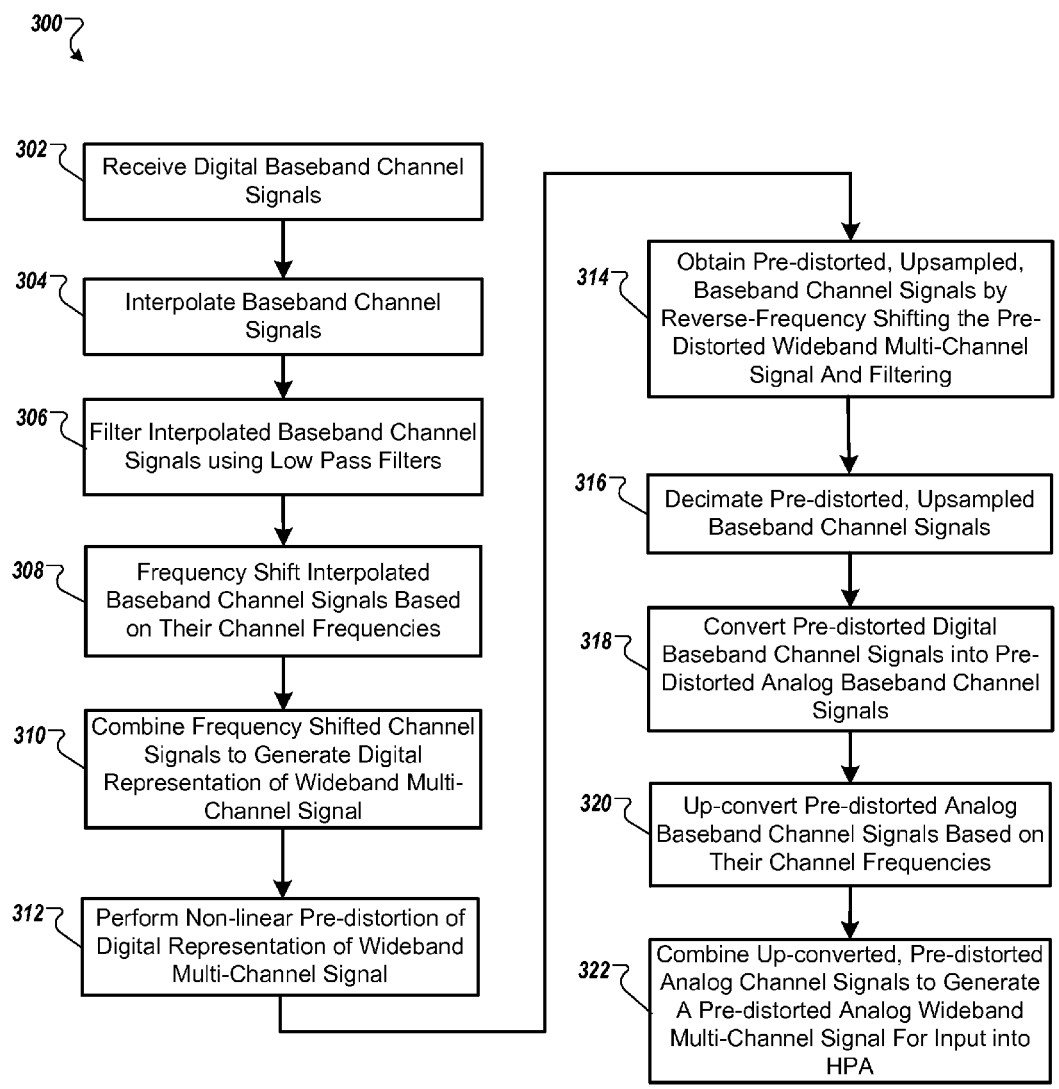
FIG. 3 illustrates an example process performed by a communications system for multi-channel digital linearization.

FIG. 3 illustrates an example process 300 for multi-channel digital linearization in a communications system. The process 300 may be performed by a system that is implemented on the signal path before a signal is input into an HPA, such as the system 100 that, in some implementations, includes the digital circuit 200. Accordingly, the following sections describe the process 300 in the context of the system 100. However, the process 300 also may be performed by other circuits in other systems.

The process 300 is initiated by receiving multiple digital baseband channel signals (302). For example, the digital circuit 200 may receive the digital baseband waveforms 202(0) through 202(N−1), corresponding to channels 0 through N−1, respectively. The digital baseband channel signals may be interpolated (304). The digital circuit 200 may interpolate (that is, may up-sample) each digital baseband channel signal that it receives so that the sample rates of all the signals are similar and correspond to the sample rate of the wideband multi-channel signal that will be subsequently inputted in to an HPA. Each digital baseband channel signal may be up-sampled by a separate interpolator on its path. For example, the channel 0 signal 202(0) may be up-sampled by interpolator 204(0), while the channel N−1 signal 202(N−1) may be up-sampled by interpolator 204(N−1).

The interpolated, digital baseband channel signals may then be filtered using low pass filters (306). The digital circuit 200 may filter the up-sampled waveforms using LPFs to remove the effects of aliasing that are introduced by the up-sampling. Each channel-specific waveform may be filtered by a separate LPF on its path. For example, the channel 0 signal 202(0) may be filtered by LPF 206(0), while the channel N−1 signal 202(N−1) may be filtered by LPF 206(N−1).

The digital baseband channel signals may then be shifted in frequency based on their respective channel frequencies (308). The digital circuit 200 may shift the frequency spectra of the digital baseband signals so that the frequency spectra are at the appropriate relative offsets with respect to each other, as they would appear in the combined digital wideband signal. For example, each of the channel-specific digital baseband signals may be frequency shifted by an amount equal to the difference in frequency between its channel frequency and the 0 channel frequency. Since the channel 0 digital baseband signal does not need to be frequency shifted in this implementation example, a complex frequency shift circuit is not needed in the channel 0 signal path. In FIG. 2, the interpolated digital baseband signal of each of channels 1 through N−1 may be frequency shifted by a separate complex frequency shift circuit 208(1) through 208(N−1), respectively, in its path.

The frequency shifted, digital baseband channel signals are combined to generate the digital representation of the wideband multi-channel signal (310). For example, after the digital baseband channel signals are up-sampled and frequency-shifted, they may be added together by the combiner circuit 210 to create a digital wideband multi-channel signal, which is a digital representation of the analog wideband multi-channel signal.

Non-linear pre-distortion is performed on the digital representation of the wideband multi-channel signal (312). For example, the digital representation of the wideband multi-channel signal is input into the non-linear pre-distortion module 212, which modifies the wideband signal in accordance with gain and/or phase compensation values to counter the non-linear distortion that is introduced at a later stage when the analog wideband multi-channel signal is fed into the HPA 102. The non-linear pre-distortion module 212 may perform, for example, table lookups to determine the appropriate compensation values to be added to the digital wideband multi-channel signal.

After the wideband multi-channel signal has been pre-distorted by the non-linear pre-distortion module 212, a pre-distorted, baseband channel signal for each channel 0 through N−1 may then be obtained through reverse-frequency shifting and low pass filtering (314). For example, the pre-distorted wideband signal may be passed through complex frequency shift circuits, such as, for example, circuits 214(1) through 214(N−1), which undo the frequency shifts performed previously by the complex frequency shift circuits 208(1) through 208(N−1), respectively. Accordingly, a new frequency-shifted digital wideband signal is generated for each of channels 1 through N−1 that corresponds to the pre-distorted digital wideband signal outputted by module 212 frequency shifted such that the corresponding channel-specific component of the wideband signal is positioned at the baseband frequency. The pre-distorted wideband signal for channel 0 and the frequency shifted channel-specific wideband signals for channels 1 through N−1 may then be filtered using low pass filters to produce up-sampled, pre-distorted digital baseband channel signals for channels 0 through N−1.

The up-sampled, pre-distorted, digital baseband channel signals are then decimated (316). The up-sampled, pre-distorted channel signals are input into decimators to down-sample the channel signals to their original sample rates. For example, the up-sampled and pre-distorted version of the channel 1 signal 202(1) is input into the decimator 218(1) to produce at its output the pre-distorted channel 1 signal 220(1), which corresponds to a pre-distorted version of the channel 1 signal 202(1) having the same sample rate as the channel 1 signal 202(1).

At this stage, the digital circuit 200 has effectively added compensation values to each of the digital baseband channel signals to counter the effects of the non-linear distortion that are introduced at a later stage in the corresponding analog baseband signals when the latter are combined to form an analog wideband signal that is input into the HPA. The operation of the digital circuit 200 is completed.

The pre-distorted, digital channel signals may be converted into pre-distorted analog baseband channel signals (318). Each of the pre-distorted digital baseband channel signals may be fed into a DAC, which converts the digital baseband channel signal into a corresponding analog baseband channel signal. For example, DAC 106(0) may be used to convert the pre-distorted digital Channel 0 baseband signal 220(0) into a corresponding pre-distorted analog Channel 0 baseband signal, which may be sig_0. Similarly, DAC 106(N−1) may be used to convert the pre-distorted digital Channel N−1 baseband signal 220(N−1) into a corresponding pre-distorted analog Channel N−1 baseband signal, which may be sig_(N−1).

The pre-distorted analog baseband channel signals may be up-converted to their respective channel frequencies (322). For example, the pre-distorted analog baseband signals for channels 0 to N−1 may be frequency shifted by upconverters to their respective channel frequencies f_0 to f_N−1.

Subsequently, the pre-distorted, up-converted, analog channel signals are combined to form a pre-distorted analog wideband multi-channel signal for input into the HPA (324). A combiner, such as combiner 110, may combine the pre-distorted, up-converted Channel 0 through N−1 signals to form the pre-distorted analog wideband multi-channel signal, which is then input into the HPA, such as, for example, HPA 102.

The pre-distorted analog wideband multi-channel signal may then be amplified by the HPA, which may introduce some non-linear distortion into the pre-distorted analog wideband signal during the amplification. However, due to the pre-distortion performed by the digital circuit, the effects of the non-linear distortion are largely removed. Consequently, when the analog baseband channel signals are re-obtained from the wideband multi-channel signal output of the HPA, the analog baseband channel signals are substantially linear transforms of an analog version of the digital baseband channel signals that were provided to the system 100.

The multi-channel digital linearization described in the preceding sections may be realized efficiently by systems, devices and methods that are implemented based on specific parameter values for frequency shifts, interpolation rates and signal bandwidth. For example, such systems, devices and methods may include the use of polyphase filter banks, Fast Fourier Transforms (FFTs), and other suitable multi-rate digital signal processing (DSP) techniques.

Figure 4:
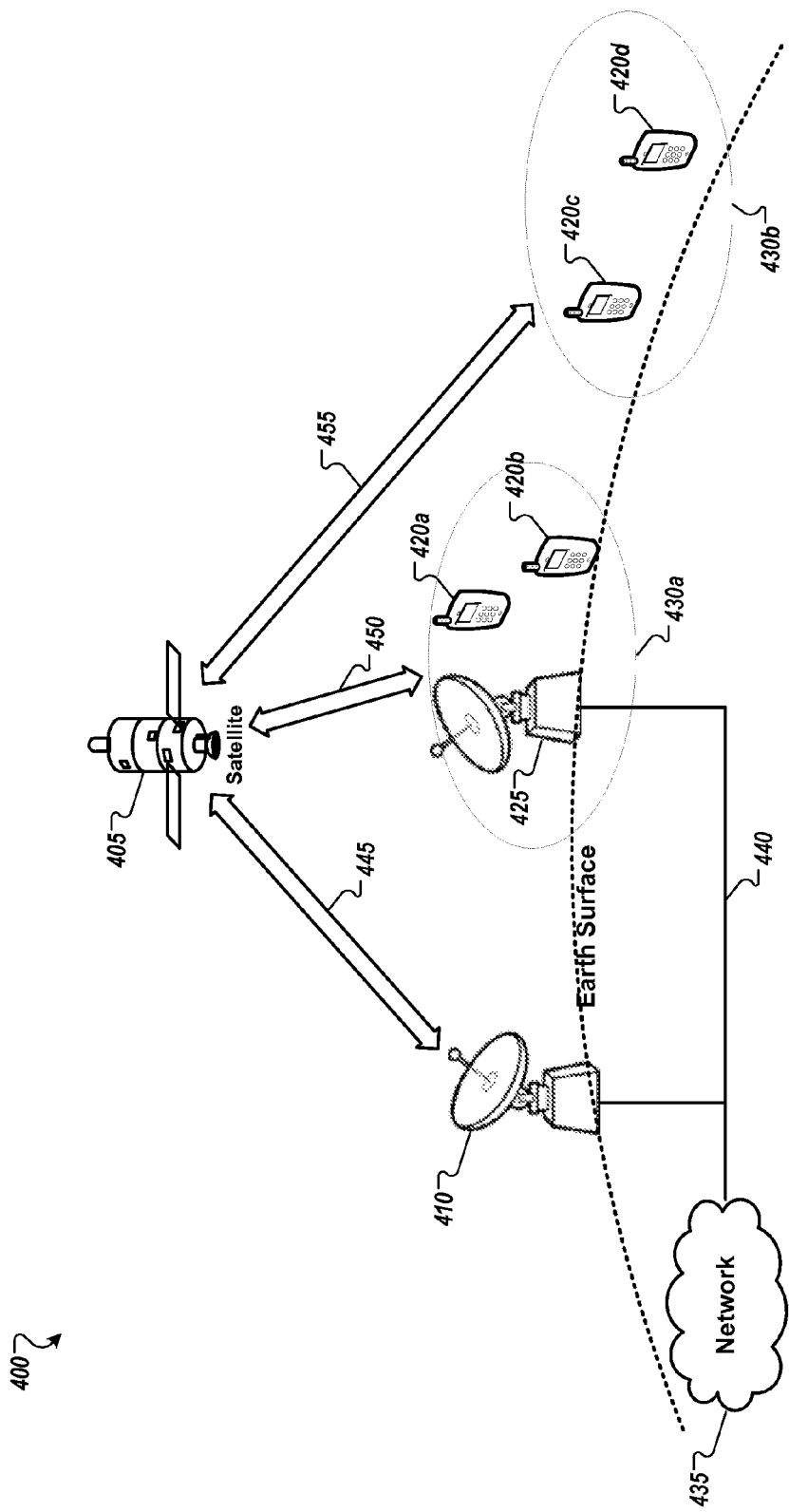
FIG. 4 illustrates an example communications system in which multi-channel digital linearization may be used.

FIG. 4 illustrates an example of a communications system 400 in which multi-channel digital linearization may be used. The communications system 400 is a satellite communications system, which includes a satellite 405 connected through satellite channels to gateways 410 and 425, and user terminals 420a, 420b, 420c and 420d located on the Earth's surface. The satellite 405 transmits data to and receives data from the gateways 410, 425, and user terminals 420a, 420b, 420c and 420d. Gateway 425 and user terminals 420a-420b are located within the geographic extent covered by spot beam 430a, while user terminals 420c-420d are located within the geographic extent covered by spot beam 430b. The gateways 410 and 425 are terrestrially connected to each other and to a terrestrial network 435 through communications link 440.

The satellite 405 may be located at a geostationary orbital location defined by a longitude. Alternatively, the satellite 405 may be located at a different orbital location, for example, a medium earth orbit or a low earth orbit. The satellite 405 interconnects the gateway 410, the gateway 425 and user terminals 420a, 420b in spot beam 430a, and the user terminals 420c, 420d in spot beam 430b, through satellite communications channels. A beam may cover a geographic area that includes one or more gateways (for example, spot beam 430a), or a beam may cover a geographic area that includes zero gateways (for example, 430b).

The satellite 405 includes multiple antenna elements to enable transmission of information in both directions from the satellite 405 to the gateways or user terminals. The antenna elements transmit signals to or receive signals from the gateways 410, 425 and the user terminals 420a-420d.

The gateways 410 and 425 are coupled to the network 435 through a communications link 440. The network 435 may be a non-public data network, a public data network or a combination of public and non-public data networks, for example, the Internet. The communications channel 440 may be a high-speed terrestrial connection, such as an optical connection with data rates in the range of gigabits per second. In an alternative implementation, the communications channel 440 also may be a satellite communications channel through a satellite that is different from the satellite 405.

The gateways 410 and 425 may include one or more modules that process signals exchanged with the satellite elements for beamforming. The gateways 410 and 425 may transmit signals to the satellite 405 over the satellite return links for phase and/or gain calibration for the return link and the forward link.

The communications link 440 may be part of a closed network accessible only to components of the satellite communications system 100, or may be part of an open network that connects the gateway 410 to the network 435.

The user terminals 420a-420d are computing devices able to communicate data to and from the satellite 405 over a satellite link. For example, the user terminals 420a-420d may be handheld mobile telephones or car phones, personal digital assistants, laptop personal computers, desktop personal computers, and/or geographically fixed phone booths. The user terminals in separate satellite coverage areas serviced by different formed beams may communicate with each other and with the gateways 410 and 425 over the satellite 405 via the satellite links 445, 450 and 455. Each satellite link 445, 450 or 455 includes both an uplink to the satellite 405 and a downlink from the satellite 405.

Each antenna element on the satellite 405 may receive signals over multiple channels, and transmit signals over multiple channels. A wideband HPA may be coupled to each antenna element, such that wideband multi-channel signals transmitted through the antenna elements are amplified. To compensate for the non-linear distortion that may be introduced by the HPAs, the satellite 405 may implement multi-channel digital linearization. Therefore, the system 100, including, for example, the digital circuit 200 may be coupled to each antenna element on the satellite 405, on the signal path prior to the corresponding HPA.

The gateways 410 and 425 also may receive and transmit signals over multiple channels. Therefore, each gateway may use a HPA for wideband multi-channel signal amplification, and each gateway may implement multi-channel digital linearization to compensate for the non-linear distortion due to the HPAs. Accordingly, the system 100, including the digital circuit 200 may be coupled to each satellite gateway 410 and 425, on the signal path prior to the associated HPA.

It is to be noted that the communications system 400 described above is only one example of a communications system that may implement the multi-channel digital linearization described in this disclosure. Other communications systems, such as terrestrial networks, also may implement the described techniques.

Implementations of the above techniques include one or more methods, computer program products and system. A computer program product is suitably embodied in a non-transitory machine-readable medium and includes instructions executable by one or more processors. The instructions are configured to cause the one or more processors to perform the above described actions.

A system includes one or more processors and instructions embedded in a non-transitory machine-readable medium that are executable by the one or more processors. The instructions, when executed, are configured to cause the one or more processors to perform the above described actions.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (for example, magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The elements of a computer may include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the systems and techniques described here can be implemented on a computer having a display device (for example, a CRT (cathode ray tube) or LCD (liquid crystal display) monitor) for displaying information to the user and a keyboard and a pointing device (for example, a mouse or a trackball) by which the user can provide input into the computer. Other kinds of devices can be used to provide for interaction with a user as well; for example, feedback provided to the user can be any form of sensory feedback (for example, visual feedback, auditory feedback, or tactile feedback); and input from the user can be received in any form, including acoustic, speech, or tactile input.

The systems and techniques described here can be implemented in a computing system that includes a back end component (for example, as a data server), or that includes a middleware component (for example, an application server), or that includes a front end component (for example, a client computer having a graphical user interface or a Web browser through which a user can interact with an implementation of the systems and techniques described here), or any combination of such back end, middleware, or front end components. The components of the system can be interconnected by any form or medium of digital data communication (for example, a communication network). Examples of communication networks include a local area network ("LAN"), a wide area network ("WAN"), a satellite network and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention. For example, much of this document has been described with respect to messaging and mapping applications, but other forms of graphical applications may also be addressed, such as interactive program guides, web page navigation and zooming, and other such applications.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
    receiving digital baseband channel signals that are digital versions of analog baseband channel signals, each of the digital baseband channel signals being associated with an original sampling rate and a different channel frequency;
    up-sampling the digital baseband channel signals to a common sampling rate;
    filtering the digital baseband channel signals using low pass filters for removing aliases generated due to the up-sampling;
    performing, based on the associated different channel frequencies, complex frequency shifting of the filtered digital baseband channel signals to obtain digital channel signals;
    combining the digital channel signals to generate a digital wideband multi-channel signal, the digital wideband multi-channel signal being a digital representation of an analog wideband multi-channel signal that is based on combining analog channel signals that correspond to the analog baseband channel signals;
    performing a non-linear pre-distortion of the digital wideband multi-channel signal, the non-linear pre-distortion adding at least one of a gain and a phase shift to the digital wideband multi-channel signal such that the digital channel signals included within the digital wideband multi-channel signal are compensated for a non-linear distortion effected on the analog wideband multi-channel signal by a high-power amplifier (HPA);
    obtaining pre-distorted digital baseband channel signals that correspond to the received digital baseband channel signals by producing frequency-shifted versions of the pre-distorted digital wideband multi-channel signal based on the associated different channel frequencies and filtering the frequency-shifted versions using low pass filters; and
    down-sampling the pre-distorted digital baseband channel signals from the common sampling rate to their respective original sampling rates.

2. The method of claim 1, comprising:
    converting the pre-distorted digital baseband channel signals to corresponding pre-distorted analog baseband channel signals;
    up-converting the pre-distorted analog baseband channels signals to non-overlapping frequency spectra that correspond to the frequency spectra occupied by the analog baseband channels signals when they are combined into the analog wideband multi-channel signal;
    combining the up-converted analog baseband channel signals into pre-distorted analog wideband multi-channel signal; and feeding the pre-distorted analog wideband multi-channel signal to the HPA.

3. The method of claim 2, wherein the pre-distorted analog baseband channels signals are compensated for the non-linear distortion due to the HPA based on the non-linear pre-distortion performed on the digital wideband multi-channel signal.

4. The method of claim 1, wherein up-sampling the digital baseband channel signals to the common sampling rate comprises:
   passing each individual digital baseband channel signal through a separate interpolator, which is an electronic circuit configured for up-sampling a signal that is input into the interpolator.

5. The method of claim 1, wherein performing the complex frequency shifting of the filtered digital baseband channel signals comprises:
   passing each individual digital baseband channel signal through a separate complex frequency shift circuit, which is an electronic circuit configured for shifting the frequency of a signal at its input,
   wherein the digital channel signals produced at the outputs of the complex frequency shift circuits include frequencies that are at the appropriate relative offsets with respect to each other such that the digital channel signals do not overlap in frequency when they are combined together into the digital wideband multi-channel signal.

6. The method of claim 1, wherein performing a non-linear pre-distortion of the digital wideband multi-channel signal comprises:
   passing the digital wideband multi-channel signal through a non-linear pre-distortion module, which is an electronic circuit configured for performing linearization on a signal that is input into the non-linear pre-distortion module;
   determining, using the non-linear pre-distortion module, the amplitude and the phase of the digital wideband multi-channel signal that is input into the non-linear pre-distortion module;
   performing a first table lookup, using the non-linear pre-distortion module, to map the determined amplitude of the input digital wideband multi-channel signal to an output amplitude;
   performing a second table lookup, using the non-linear pre-distortion module, to determine the phase shift that is to be applied to the digital wideband multi-channel signal based on the determined phase of the input digital wideband multi-channel signal; and
   pre-distorting, using the non-linear pre-distortion module, the digital wideband multi-channel signal by at least one of adding the gain to the digital wideband multi-channel signal corresponding to the output amplitude, and shifting the phase of the digital wideband multi-channel signal corresponding to the phase shift.

7. The method of claim 6, wherein the output amplitude and the phase shift are determined to counter amplitude distortion and phase shift, respectively, subsequently applied to the corresponding analog wideband multi-channel signal when passed through the HPA.

8. A system comprising:
   a processor; and
   a non-transitory machine-readable medium storing instructions that are executable by the processor and, when executed, configured to cause the processor to perform operations comprising:
   receiving digital baseband channel signals that are digital versions of analog baseband channel signals, each of the digital baseband channel signals being associated with an original sampling rate and a different channel frequency;
   up-sampling the digital baseband channel signals to a common sampling rate;
   filtering the digital baseband channel signals using low pass filters for removing aliases generated due to the up-sampling;
   performing, based on the associated different channel frequencies, complex frequency shifting of the filtered digital baseband channel signals to obtain digital channel signals;
   combining the digital channel signals to generate a digital wideband multi-channel signal, the digital wideband multi-channel signal being a digital representation of an analog wideband multi-channel signal that is based on combining analog channel signals that correspond to the analog baseband channel signals;
   performing a non-linear pre-distortion of the digital wideband multi-channel signal, the non-linear pre-distortion adding at least one of a gain and a phase shift to the digital wideband multi-channel signal such that the digital channel signals included within the digital wideband multi-channel signal are compensated for a non-linear distortion effected on the analog wideband multi-channel signal by a high-power amplifier (HPA);
   obtaining pre-distorted digital baseband channel signals that correspond to the received digital baseband channel signals by producing frequency-shifted versions of the pre-distorted digital wideband multi-channel signal based on the associated different channel frequencies and filtering the frequency-shifted versions using low pass filters; and
   down-sampling the pre-distorted digital baseband channel signals from the common sampling rate to their respective original sampling rates.

9. The system of claim 8, wherein the instructions are configured to cause the processor to perform operations comprising:
   converting the pre-distorted digital baseband channel signals to corresponding pre-distorted analog baseband channel signals;
   up-converting the pre-distorted analog baseband channels signals to non-overlapping frequency spectra that correspond to the frequency spectra occupied by the analog baseband channels signals when they are combined into the analog wideband multi-channel signal;
   combining the up-converted analog baseband channel signals into pre-distorted analog wideband multi-channel signal; and
   feeding the pre-distorted analog wideband multi-channel signal to the HPA.

10. The system of claim 9, wherein the pre-distorted analog baseband channels signals are compensated for the non-linear distortion due to the HPA based on the non-linear pre-distortion performed on the digital wideband multi-channel signal.

11. The system of claim 8, comprising a plurality of interpolators, wherein the instructions that are configured to cause the processor to perform operations comprising up-sampling the digital baseband channel signals to the common sampling rate include instructions configured to cause the processor to perform operations comprising:
   passing each individual digital baseband channel signal through a separate interpolator, which is an electronic circuit configured for up-sampling a signal that is input into the interpolator.

12. The system of claim 8, comprising a plurality of complex frequency shift circuits, wherein the instructions that are configured to cause the processor to perform operations comprising performing the complex frequency shifting of the filtered digital baseband channel signals include instructions configured to cause the processor to perform operations comprising:

passing each individual digital baseband channel signal through a separate complex frequency shift circuit, which is an electronic circuit configured for shifting the frequency of a signal at its input, wherein the digital channel signals produced at the outputs of the complex frequency shift circuits include frequencies that are at the appropriate relative offsets with respect to each other such that the digital channel signals do not overlap in frequency when they are combined together into the digital wideband multi-channel signal.

13. The system of claim 8, comprising a non-linear pre-distortion module, wherein the instructions that are configured to cause the processor to perform operations comprising performing a non-linear pre-distortion of the digital wideband multi-channel signal include instructions configured to cause the processor to perform operations comprising:

passing the digital wideband multi-channel signal through a non-linear pre-distortion module, which is an electronic circuit configured for performing linearization on a signal that is input into the non-linear pre-distortion module;

determining, using the non-linear pre-distortion module, the amplitude and the phase of the digital wideband multi-channel signal that is input into the non-linear pre-distortion module;

performing a first table lookup, using the non-linear pre-distortion module, to map the determined amplitude of the input digital wideband multi-channel signal to an output amplitude;

performing a second table lookup, using the non-linear pre-distortion module, to determine the phase shift that is to be applied to the digital wideband multi-channel signal based on the determined phase of the input digital wideband multi-channel signal; and pre-distorting, using the non-linear pre-distortion module, the digital wideband multi-channel signal by at least one of adding the gain to the digital wideband multi-channel signal corresponding to the output amplitude, and shifting the phase of the digital wideband multi-channel signal corresponding to the phase shift.

14. The system of claim 13, wherein the output amplitude and the phase shift are determined to counter amplitude distortion and phase shift, respectively, subsequently applied to the corresponding analog wideband multi-channel signal when passed through the HPA.

15. The system of claim 8, comprising a satellite, wherein the non-linear pre-distortion is performed at each antenna element included in the satellite that is configured for transmitting a signal, the non-linear pre-distortion performed at each antenna element prior to passing the signal through an HPA associated with the respective antenna element.

* * * * *